United States Patent
Yang et al.

(10) Patent No.: US 11,048,014 B2
(45) Date of Patent: Jun. 29, 2021

(54) RINGING REDUCTION IN A NUCLEAR MAGNETIC RESONANCE LOGGING TOOL

(71) Applicant: Halliburton Energy Services, Inc., Houston, TX (US)

(72) Inventors: Jie Yang, Houston, TX (US); Lilong Li, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 14 days.

(21) Appl. No.: 16/576,567

(22) Filed: Sep. 19, 2019

(65) Prior Publication Data

US 2020/0116889 A1 Apr. 16, 2020

Related U.S. Application Data

(60) Provisional application No. 62/744,396, filed on Oct. 11, 2018.

(51) Int. Cl.
*G01V 3/32* (2006.01)
*G01R 33/38* (2006.01)
*E21B 49/00* (2006.01)

(52) U.S. Cl.
CPC ........... *G01V 3/32* (2013.01); *E21B 49/00* (2013.01); *G01R 33/3808* (2013.01)

(58) Field of Classification Search
CPC ........ G01V 3/32; G01R 33/3808; E21B 49/00
See application file for complete search history.

(56) References Cited

U.S. PATENT DOCUMENTS

| 5,055,787 | A | | 10/1991 | Kleinberg et al. | |
|---|---|---|---|---|---|
| 5,557,201 | A | * | 9/1996 | Kleinberg | G01N 24/081 324/303 |
| 5,629,623 | A | * | 5/1997 | Sezginer | G01N 24/081 324/303 |
| 5,644,231 | A | * | 7/1997 | Wignall | G01N 24/081 324/303 |
| 5,705,927 | A | * | 1/1998 | Sezginer | G01N 24/081 324/303 |
| 5,767,674 | A | * | 6/1998 | Griffin | G01V 3/32 324/303 |
| 5,914,598 | A | * | 6/1999 | Sezginer | G01N 24/081 324/300 |
| 5,994,901 | A | * | 11/1999 | McIntyre | G01N 24/081 324/303 |
| 6,008,646 | A | * | 12/1999 | Griffin | G01V 3/32 324/303 |
| 6,026,560 | A | * | 2/2000 | Wignall | G01N 24/081 29/607 |
| 6,268,726 | B1 | * | 7/2001 | Prammer | G01V 3/32 324/303 |

(Continued)

*Primary Examiner* — Dixomara Vargas
(74) *Attorney, Agent, or Firm* — Gilliam IP PLLC

(57) ABSTRACT

A nuclear magnetic resonance (NMR) logging tool configured to be positioned in a borehole created in a subsurface formation. The NMR logging tool includes a magnet to induce a magnetic field in the subsurface formation, a transmission line, and a first shield positioned between the magnet and the transmission line. The NMR logging tool includes a transmitter and an antenna coupled to the transmitter by the transmission line. The antenna is to transmit a radio frequency (RF) magnetic field into the subsurface formation in response to the transmitter supplying power by the transmission line.

19 Claims, 9 Drawing Sheets

(56) References Cited

U.S. PATENT DOCUMENTS

| | | | |
|---|---|---|---|
| 6,362,619 B2* | 3/2002 | Prammer | G01V 3/32 |
| | | | 324/303 |
| 6,583,621 B2* | 6/2003 | Prammer | G01V 3/32 |
| | | | 324/303 |
| 6,825,659 B2* | 11/2004 | Prammer | G01V 3/32 |
| | | | 324/303 |
| 7,084,625 B2 | 8/2006 | Kruspe et al. | |
| 2001/0045829 A1* | 11/2001 | Prammer | G01V 3/32 |
| | | | 324/303 |
| 2002/0163335 A1* | 11/2002 | Prammer | G01N 24/081 |
| | | | 324/303 |
| 2004/0124837 A1* | 7/2004 | Prammer | G01N 24/081 |
| | | | 324/303 |
| 2004/0183538 A1* | 9/2004 | Hanstein | G01V 3/28 |
| | | | 324/339 |
| 2006/0118758 A1* | 6/2006 | Wang | A61L 31/18 |
| | | | 252/62.51 R |
| 2017/0082772 A1* | 3/2017 | Xiao | G01R 33/341 |

\* cited by examiner

RINGING REDUCTION IN A NUCLEAR MAGNETIC RESONANCE LOGGING TOOL

BACKGROUND

The disclosure generally relates to the field of downhole Nuclear Magnetic Resonance (NMR), and more particularly to ringing reduction in an NMR logging tool for subsurface formation evaluation.

In the field of logging (e.g., wireline logging, logging while drilling (LWD) and measurement while drilling (MWD)), NMR tools have been used to explore the subsurface based on the magnetic interactions with subsurface material. By tuning a radio frequency (RF) pulse to the correct frequency or band, a resonant response can be elicited from hydrogen in formation materials. NMR logging can provide accurate measurements of a variety of petrophysical variables, including hydrogen porosity. Hydrogen porosity, when considered alongside other characteristics determined via NMR logging, may correspond to hydrocarbon porosity, allowing the detection and characterization of hydrocarbons in surrounding formations through NMR logging.

BRIEF DESCRIPTION OF THE DRAWINGS

Embodiments of the disclosure may be better understood by referencing the accompanying drawings.

DESCRIPTION

Figure 1:
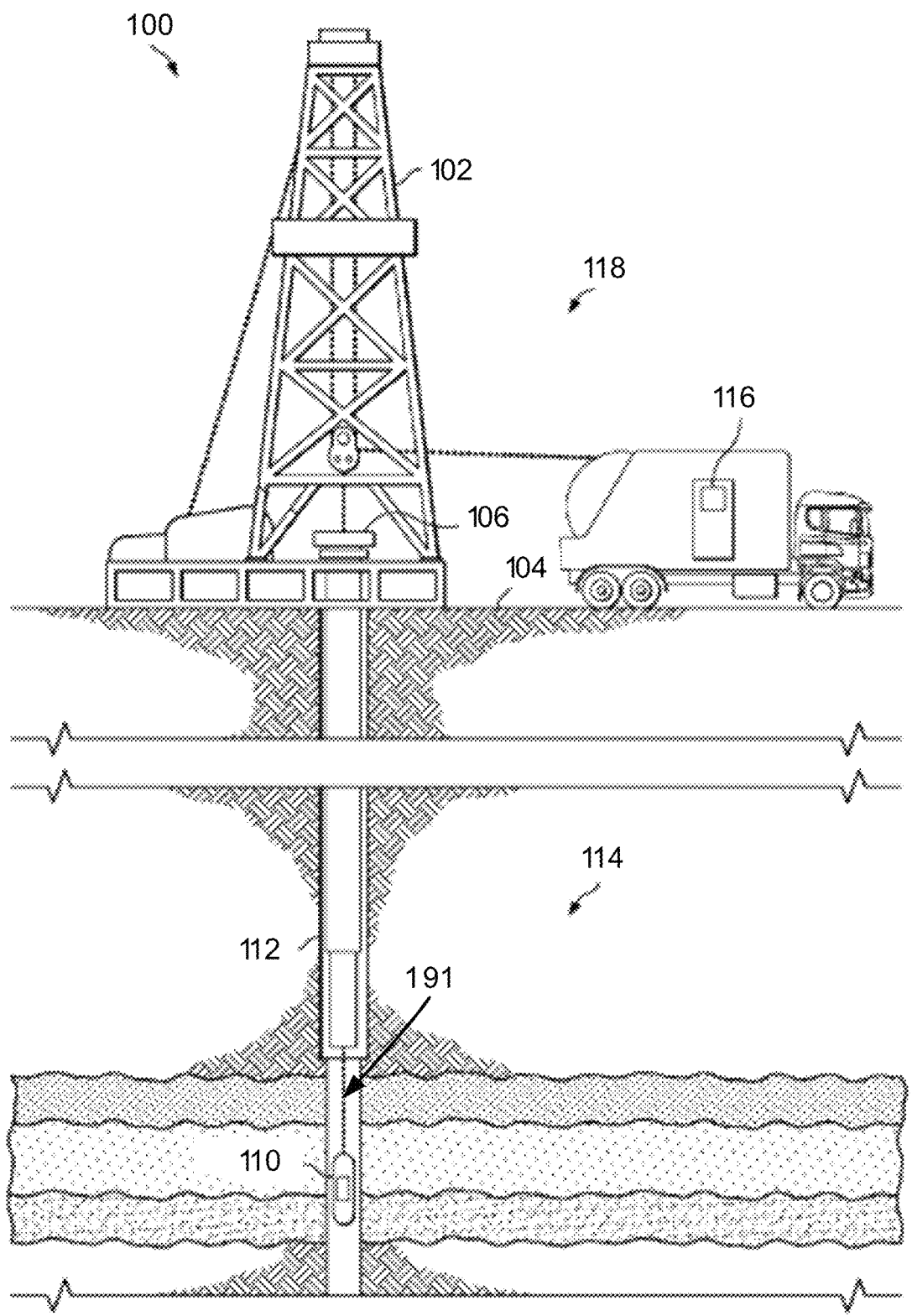
FIG. 1 is a partial cutaway diagram depicting an example wireline NMR logging system, according to some embodiments.

The description that follows includes example systems, methods, techniques, and program flows that embody aspects of the disclosure. However, it is understood that this disclosure may be practiced without these specific details. For instance, this disclosure refers to using copper sheets for separating components of an NMR logging tool in illustrative examples. Aspects of this disclosure can use other types of sheeting (e.g., aluminum) to reduce ringing reduction in an NMR logging tool (as described herein). In other instances, well-known instruction instances, protocols, structures and techniques have not been shown in detail in order not to obfuscate the description.

NMR measurement logging can provide valuable data for hydrocarbon recovery. However, ringing can occur during operation of the NMR logging tool, causing distortion of the NMR measurements. For example, during operation, an antenna of the NMR logging tool is powered to emit a radio frequency (RF) magnetic field into the subsurface formation. To power the antenna, a large amount of current such as on the order of 100 amps or more and with voltage on the order of kilo-voltage or more is supplied to the antenna through a transmission line. This can cause the transmission line to act as a magnet thereby causing the transmission line to interact with magnets in the NMR logging tool positioned near the transmission line.

Additionally, the NMR logging tool is encased in a housing formed as a metal sleeve for a portion that includes a segment of one or more transmission lines. This metal sleeve can become magnetized from the magnets in the NMR logging tool. Accordingly, the transmission line (when acting as a magnet) can interact with the metal sleeve of the NMR logging tool. Also, the metal sleeve can interact with the magnets in the NMR logging tool. These interactions may result in ringing in the NMR logging tool during a spin-echo response phases (i.e., receiver phases) of the NMR measurement cycles.

In particular, emission of the RF magnetic field into the subsurface formation by the antenna can cease after a defined period by no longer supplying current to the antenna through the transmission line. The antenna can then begin operating as a receiver antenna to capture NMR signals that are a result of the emission of the RF magnetic field being emitted into the subsurface formation. However, even after the transmission line ceases transmission of current to the antenna, the interaction between the transmission line and the metal sleeve of the NMR logging tool and the interaction between the transmission line and the magnets in the NMR logging tool remains. These electromagnetic interactions show up as ringing. Therefore, the receiver will receive the NMR signals collected from the subsurface formation and this ringing (the interactions). Accordingly, the NMR spin-echo signals received by the receiver can be corrupted by the ringing.

Some embodiments include one or more shields to reduce or remove electromagnetic (EM) interaction between the transmission line and the magnets and the EM interaction between the metal sleeve and the transmission line. For example, a first shield can be positioned around the magnets between the magnets and the transmission line. This first shield can decouple EM interaction between the transmission line and the magnets. A second shield can be positioned between the transmission line and the metal sleeve that is encasing the NMR logging tool. This second shield can decouple EM interaction between the transmission line and the metal sleeve that is encasing the NMR logging tool. By shielding magnets and transmission lines with a metal shield, ringing can be reduced by a factor of 10 or more, reducing ringing and improving the data quality.

In some embodiments, the shields are composed of a metallic material having high conductivity such that the shielding is relatively thin, wherein thin can be defined such that the resonance frequency (i.e., frequency that induces mechanical vibration) of the RF shield is substantially offset from the NMR transmit RF signal to prevent vibration interference from the shielding. For instance, the thickness of the shielding material may be set such that the resonant frequency is much higher than the RF signal. The shields may be composed of one of more of a number of high-conductivity materials such as copper, aluminum, gold, silver, titanium, etc. In some embodiments, the shielding can include a metal mesh. Additionally, the shielding can include multiple layers of metal sheets or mesh, provided that there is insulating material between adjacent layers with good damping properties. Thus, the shielding can be composed of any metal since multiply layers can achieve the requirements of minimal thickness for each layer (less than acoustic wavelength/2) and total conductance (proportional to total cross area of multiply layers) that is required to attenuate a ringing signal to be 5% or less of the received spin-echo signal. However, for NMR logging tools, when shielding is too close to the antenna, the NMR signal can be shielded and thus could significantly reduce or be canceled when the amplitude of the NMR signal is small (e.g., in the order of nano volts). Therefore, the shielding on one or both ends of an NMR tool may be axially offset by a substantial gap distance from the antenna.

An NMR sleeve can house the NMR logging tool and can be composed of a substantially non-conductive material such as fiber glass. The NMR sleeve can be composed of a combination of fiber glass over or near the antenna, and metal in areas further away in terms of being axially offset from the antenna. Titanium can be used for the part of the metallic portion of the sleeve housing due to its very low ferromagnetic (substantially non-magnetic) property. However, titanium is much more expensive (five times typically) in comparison to stainless steel. Stainless steel, however, exhibits a much stronger magnetic property which may introduce more ringing.

Shielding magnets from RF with shielding layers such as metal sheets reduces interaction among the magnets, the transmission line and the metal part of the NMR sleeve, thus reducing ringing. Additionally, some embodiments can reduce inter-echo spacing between pulses (such inter-echo spacing known as "TE"). This reduction in TE may enable NMR logging tools to capture faster signals and can also improve signal to noise ratio by collecting more samples per unit time. Accordingly, some embodiments provide a simple solution at a low cost for ringing reduction for NMR logging. Additionally, some embodiments can be retrofitted into existing NMR logging tools. In contrast to conventional approaches, some embodiments can have a shorter TE and increased SNR per unit time with lower cost for more frequency band(s). Also, more frequency measurements also help better T1 (longitudinal relaxation)-T2D (transverse relaxation), for example. Thus, some embodiments provide better data quality, capture fast decay components, and allow for more flexible activation design.

Example Systems

In some embodiments, the NMR logging tool described herein can be part of a wireline NMR logging system or a drilling system. FIG. 1 depicts an example wireline NMR logging system, according to some embodiments. In particular, FIG. 1 depicts a well system 100 that includes surface equipment 118 at the surface 104. The well system 100 also includes a derrick 102, a wellhead 106 and a conveyance 191. The derrick 102 deploys, via a conveyance 191 an NMR logging tool 110 into a borehole 112 in a formation 114. The conveyance 191 can be wireline, slickline, coiled tubing, pipe, tubing, or one or more downhole tractors, etc. In one or more embodiments, the conveyance 191 can supply power and/or telemetry to the NMR logging tool 110.

The NMR logging tool 110 includes at least one antenna to produce pulses in the formation 114. Using the pulses, the NMR logging tool 110 collects data on NMR signals that indicate characteristics of the formation 114. Data from the NMR logging tool 110 can be communicated to a computer 116. In some embodiments, the computer 116 may be located at the surface 104, integrated into the NMR logging tool 110, or located elsewhere and fed data over a network or transferable media device.

Figure 2:
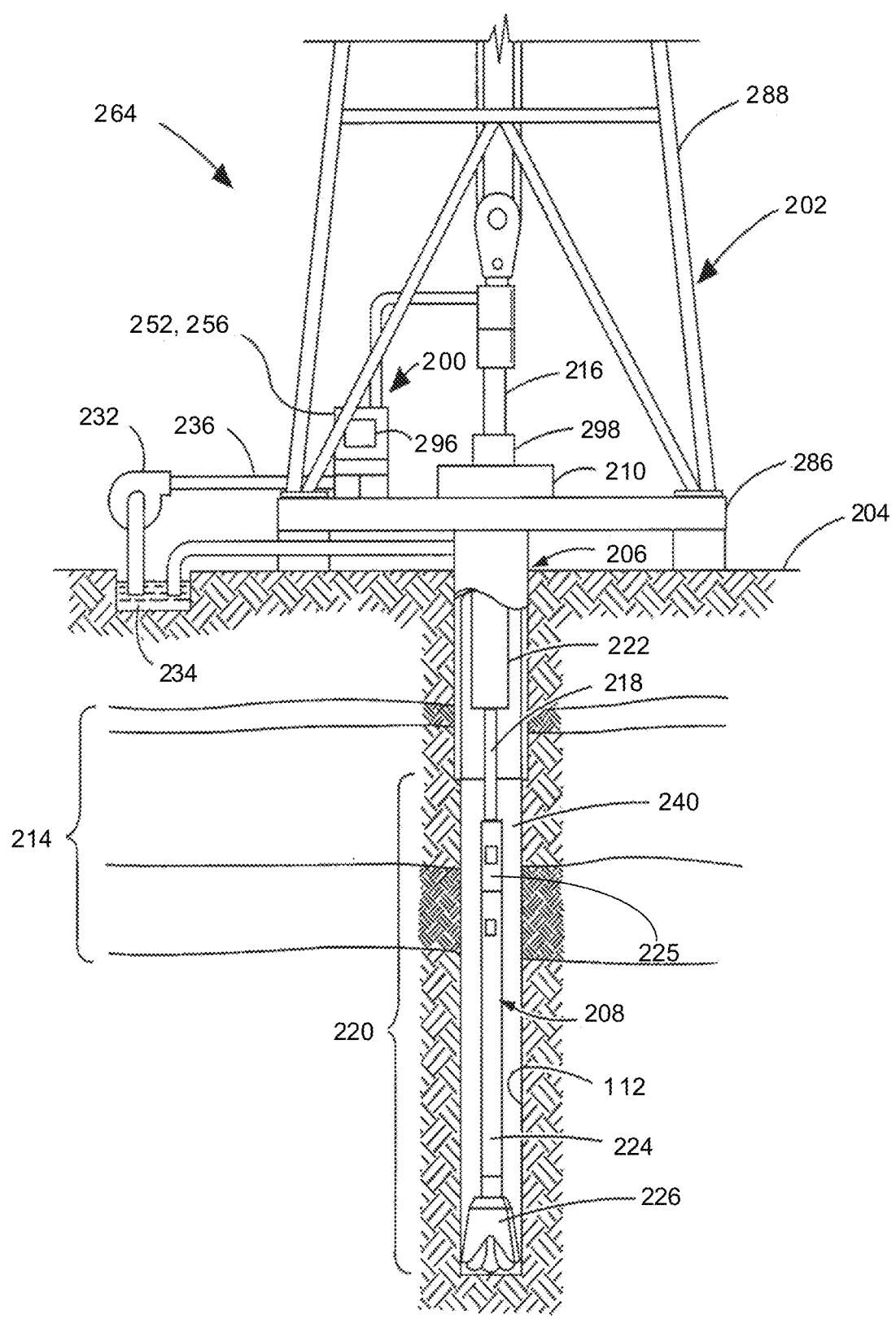
FIG. 2 is a partial cutaway diagram depicting an example drilling rig system that may implement an NMR logging tool, according to some embodiments.

In some embodiments, the NMR logging tool described herein can be part of a drilling system. FIG. 2 depicts an example drilling rig system, according to some embodiments. As shown in FIG. 2, a system 264 includes a drilling rig 202 located at the surface 204 of a well 206. Drilling of oil and gas wells is commonly carried out using a string of drill pipes connected together to form a drilling string 208 that is lowered through a rotary table 210 into a wellbore or borehole 112. A drilling platform 286 is equipped with the derrick 102 that supports a hoist.

The drilling rig 202 may thus provide support for the drill string 208. The drill string 208 may operate to penetrate the rotary table 210 for drilling the borehole 112 through subsurface formations 214. The drill string 208 may include a Kelly 216, drill pipe 218, and a bottom hole assembly 220, perhaps located at the lower portion of the drill pipe 218. The bottom hole assembly 220 may include drill collars 222, a down hole tool 224, and a drill bit 226. The drill bit 226 may operate to create the borehole 112 by penetrating the surface 204 and subsurface formations 214. The down hole tool 224 may comprise any of a number of different types of tools including MWD tools, LWD tools, and others. In some embodiments, the down hole tool 224 includes an NMR logging tool 225 that may be configured as described herein).

During drilling operations, the drill string 208 (perhaps including the Kelly 216, the drill pipe 218, and the bottom hole assembly 220) may be rotated by the rotary table 210. In addition to, or alternatively, the bottom hole assembly 220 may also be rotated by a motor (e.g., a mud motor) that is located down hole. The drill collars 222 may be used to add weight to the drill bit 226. The drill collars 222 may also operate to stiffen the bottom hole assembly 220, allowing the bottom hole assembly 220 to transfer the added weight to the drill bit 226, and in turn, to assist the drill bit 226 in penetrating the surface 204 and subsurface formations 214.

During drilling operations, a mud pump 232 may pump drilling fluid (sometimes known by those of ordinary skill in the art as "drilling mud") from a mud pit 234 through a hose 236 into the drill pipe 218 and down to the drill bit 226. The drilling fluid can flow out from the drill bit 226 and be returned to the surface 204 through an annular area 240 between the drill pipe 218 and the sides of the borehole 112. The drilling fluid may then be returned to the mud pit 234, where such fluid is filtered. In some embodiments, the drilling fluid can be used to cool the drill bit 226, as well as to provide lubrication for the drill bit 226 during drilling operations. Additionally, the drilling fluid may be used to remove subsurface formation 214 cuttings created by operating the drill bit 226. It is the images of these cuttings that many embodiments operate to acquire and process.

Example NMR Logging Tool

Figure 3A:
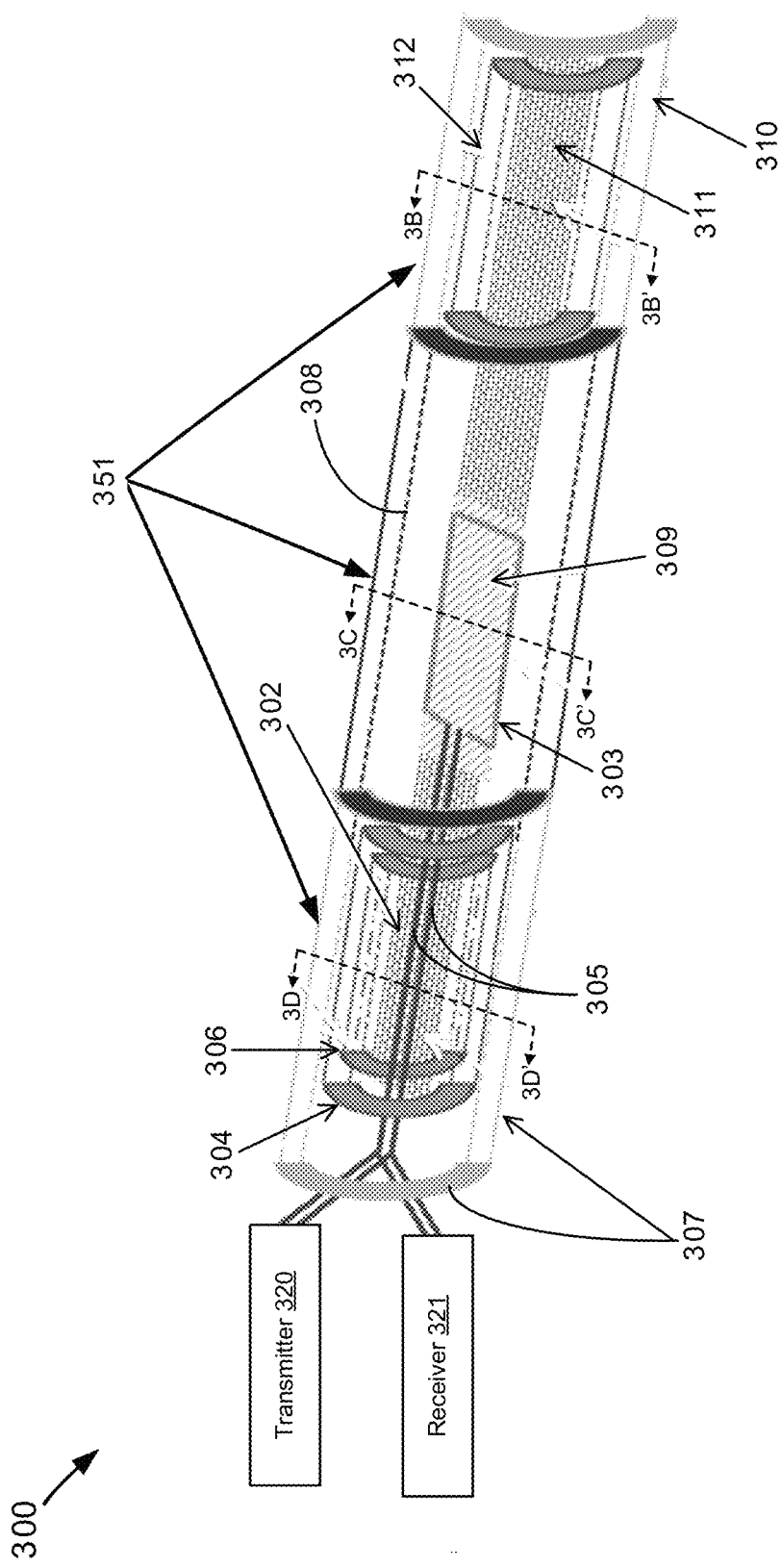
FIG. 3A is a conceptual illustration depicting an example NMR logging tool, according to some embodiments.

FIG. 3A depicts an example NMR logging tool, according to some embodiments. In particular, FIG. 3A depicts an NMR logging tool 300 that can be an example of the NMR logging tool 110 depicted in the example systems of FIGS.

1-2. The NMR logging tool 300 includes an antenna 303, magnets 302 and 311, transmission lines 305, a transmitter 320, and a receiver 321. The NMR logging tool 300 also includes an outer housing 351 that includes three sections in the form of a metal sleeve 307, a fiberglass sleeve 308, and a metal sleeve 310. The metal sleeve 307 covers at least a portion of the transmission lines 305. The metal sleeve 310 covers at least a portion of the magnets 311. The fiberglass sleeve 308 is positioned between the metal sleeve 307 and the metal sleeve 310. The fiberglass sleeve 308 is position over and covers the antenna 303.

The transmitter 320 and the receiver 321 are coupled to the antenna 303 through the transmission lines 305. In some embodiments, the magnets 302 and 311 are pre-polarization magnets. The antenna 303 is positioned around a magnet and core material 309. The antenna 303 is configured to both transmit and receive. For example, during operation, the antenna 303 is powered to emit a radio frequency (RF) magnetic field into the subsurface formation. In some embodiments, antenna 303 is powered by supplying a large amount of current to the antenna 303 through transmissions line 305. For example, the transmitter 320 can supply power to the antenna 303 through the transmission lines 305.

Emission of an RF magnetic field into the subsurface formation by the antenna 303 may cease after a defined period by no longer supplying current to the antenna 303 through the transmission lines 305. The antenna 303 can the begin acting as a receiver to capture NMR signals that are a result of the emission of the RF magnetic field being emitted into the subsurface formation. For example, the received NMR signals may comprise spin-echo signals generated by applying a static magnetic field from magnets 302 and 311 to polarize nuclear spins of material within a subterranean region and subsequently applying magnetic RF pulses generated by antenna 303 to the polarized nuclei. Various RF pulse sequences may be generated by antenna 303 to induce the spin-echo signals, including the Carr Purcell Meiboom Gill (CPMG) sequence in which nuclei spins are initially tipped using a tipping, or excitation pulse followed by a series of refocusing pulses. The antenna 303 can then transmit the received NMR signal to the receiver 321 through the transmission lines 305.

One or more sheets 304 are wrapped over and around magnets 302 such that the sheets 304 separate the magnets 302 from the transmission lines 305 (i.e., the one or more sheets 304 are at least partially disposed between the magnets 302 and the transmission lines 305). In some embodiments, the one or more sheets 304 are metal sheets. For example, the one or more sheets 304 can be copper sheets. The one or more sheets 304 can be composed of other material (such as aluminum).

One or more sheets 306 are wrapped over and around transmission lines 305 such that the one or more sheets 306 separate the transmission lines 305 from the outer housing 351 of the NMR logging tool 300 (i.e., the one or more sheets 306 are at least partially disposed between the transmission lines 305 and the outer housing 351 and/or the metal sleeve 307. In some embodiments, the one or more sheets 306 are metal sheets. For example, the one or more sheets 306 can be copper sheets. The one or more sheets 306 can be composed of other material (such as aluminum). The edges of one or more sheets 304 and 306 proximate the antenna 303 should be as close to the edge of the antenna 303 as possible but not too close to disturb the RF field generated by the antenna 303.

Figure 3B:
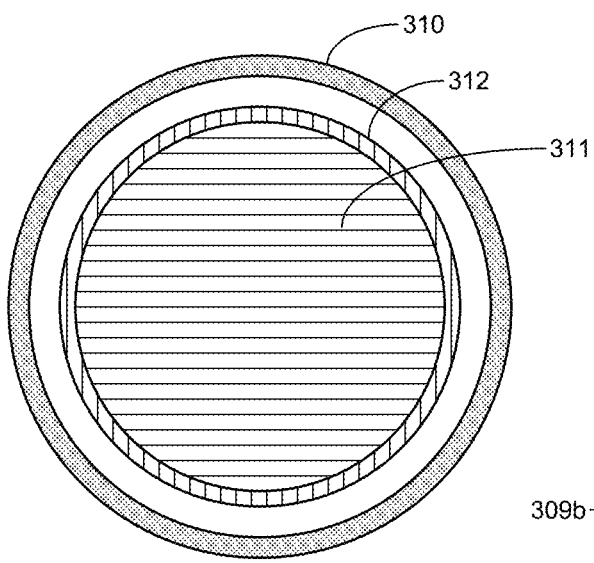
FIGS. 3B-3D are cross-section diagrams depicting an antenna section and non-antenna sections of the example NMR tool depicted in FIG. 3A.
Figure 3C:
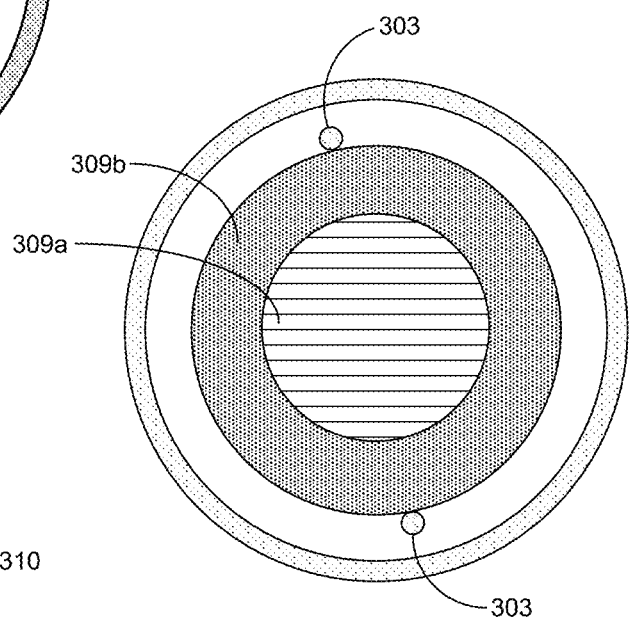
Figure 3D:
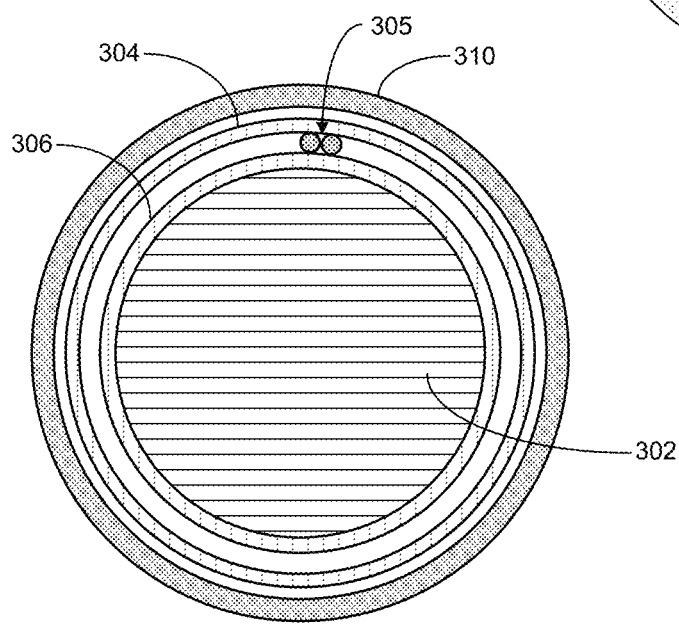

FIGS. 3B-3D are cross-section diagrams depicting the non-antenna sections of housing 351 encased by metal sleeves 307 and 310 and the antenna section encased by fiberglass sleeve 308 positioned between antenna section and non-antenna sections. For example, FIG. 3B is a cross-section diagram representing cross-section 3B-3B' showing the relative layering of the materials comprising the section encased by metal sleeve 310 including metal sheets 312. As depicted, the cross-section comprises circular and annular members at the center of which is the pre-polarized magnet 311. The section of the NMR tool bounded by metal sleeve 310 does not include transmission lines and therefore a single internal metallic shielding layer may be deployed. For example, the metal sheet 312, which may comprise one or more discrete annular layers, is disposed annularly around the exterior of the cylindrically contoured magnet 311.

FIG. 3C is a cross-section diagram representing cross-section 3C-3C' showing the relative layering of the materials comprising the section encased by fiberglass sleeve 308. As depicted, the cross-section comprises the magnet 309a centrally positioned and annularly encased by the core material 309b, which may be a ferrite material. The antenna 303 comprises one or more metallic members that may be configured in a variety of ways to interact with magnet and core material 309 with power applied to form a monopole and/or dipole antenna(s) or quadrupole antenna(s). The section of the NMR tool bounded by metal sleeve 311 may require maximum electromagnetic transmissibility and therefore does not include the internal metallic shielding layers above transmission lines deployed within the non-antenna sections.

FIG. 3D is a cross-section diagram representing cross-section 3D-3D' showing the relative layering of the materials comprising the section encased by metal sleeve 307 including metal sheets 304 and 306. As depicted, the cross-section comprises circular and annular members at the center of which is the pre-polarized magnet 302. In addition, the section of the NMR tool bounded by metal sleeve 307 includes a section of the transmission lines 305 depicted as a twisted pair of lines. In this manner, dual internal metallic shielding layers are deployed in the form of metal sheets 304 and 306. As shown, the metal sheet 306, which may comprise one or more discrete annular layers, is disposed annularly around the exterior of the cylindrically contoured magnet 302. The metal sheet 304 is disposed annularly around the transmission lines as well as the outer cylindrical contour of metal sheet 306.

Figure 4:
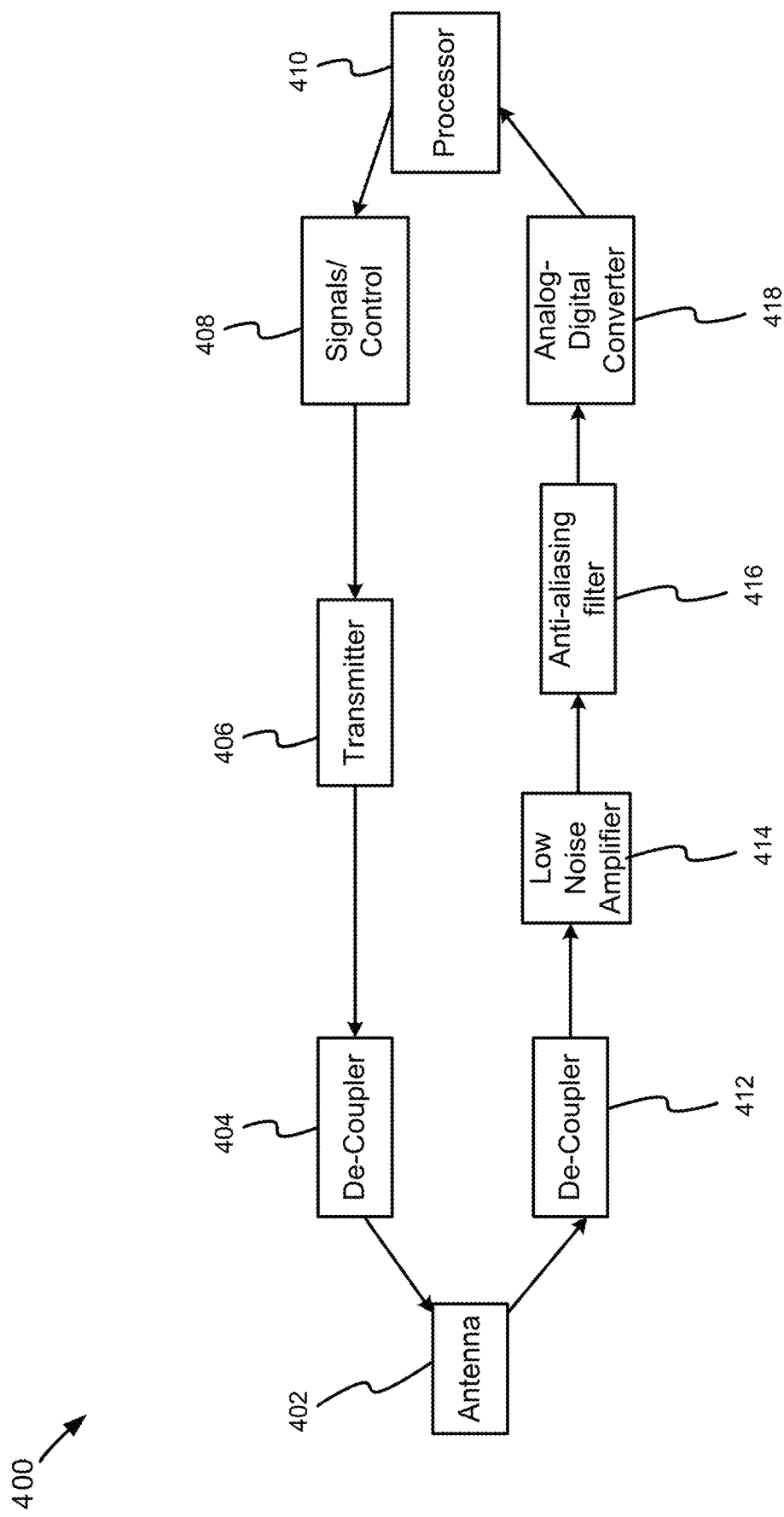
FIG. 4 is a block diagram depicting an example NMR transmitting and receiving path, according to some embodiments.

FIG. 4 depicts an example NMR transmitting and receiving path diagram, according to some embodiments. A diagram 400 includes a transmitting path on the top portion and a receiving path on the bottom portion. The transmitting path includes a processor 410, signals/control 408, transmitter 406, a de-coupler 404, and an antenna 402. During a transmitting period, the de-coupler 404 connects the transmitter 406 and the antenna 402. The processor 410 transmits signals/controls 408 to the transmitter 406. The transmitter 406 communicates the signals/controls 408 to the de-coupler 404. The de-coupler 404 then communicates the signals/controls to the antenna 402. The antenna can then induce an RF magnetic field into a subsurface formation based on the signals/controls input from the de-coupler 404. At the end of the transmitting period, the de-coupler 404 disconnects from the transmitter 406 and the antenna 402.

The receiving path includes the antenna 402, a de-coupler 412, a low noise amplifier 414, an anti-aliasing filter 416, an analog-to-digital (A/D) converter 418, and the processor 410. During a receiving period, the de-coupler 412 connects to the antenna 402 and the low noise amplifier 414. The antenna in the antenna 402 detects an NMR response that has traversed the subsurface formation that is in response to the RF magnetic field. The antenna 402 transmits the NMR response to the de-coupler 412. The de-coupler 412 then transmits the NMR response to the low noise amplifier 414, where the NMR response is amplified. The low noise amplifier 414 transmits the amplified NMR response to the anti-aliasing filter 416, where the NMR response is then filtered to remove aliasing. The anti-aliasing filter 416 transmits the filtered NMR response to the A/D converter 418, where the filtered NMR response is digitized. The A/D converter 418 transmits the digitized NMR response to the processor 410. At the end of the receiving period, the de-coupler 412 disconnects from the antenna 402 and the low noise amplifier 414.

Metal shielding can reduce RF from penetrating inside. Skin depth, $\delta$, can be defined as decayed with a factor of 1/e, can be calculated by Equation (1):

$$\delta = \frac{1}{\alpha} = \sqrt{\frac{2}{\omega\mu\sigma}} \quad (1)$$

for conditions in which $\varepsilon\omega \ll \sigma$, wherein $\omega = 2\pi \times$frequency, $\mu = \mu_0\mu_r$, and $\mu_0 = 4\pi \times 10^{-7}$ Henrys/meter, $\mu_r$=relative permeability of the shielding material, $\varepsilon$ is a dielectric property of the shieling material, and $\sigma$=conductivity of the shielding material.

Material with thickness of $3\delta$ attenuates RF down to about 5%. For copper, skin depth for 500 khz is about 0.0036 inches. So copper sheets with thickness of 0.01 inches would cut RF from penetrating by factor of 20, thus reducing the interaction and corresponding ringing accordingly.

Figure 5:
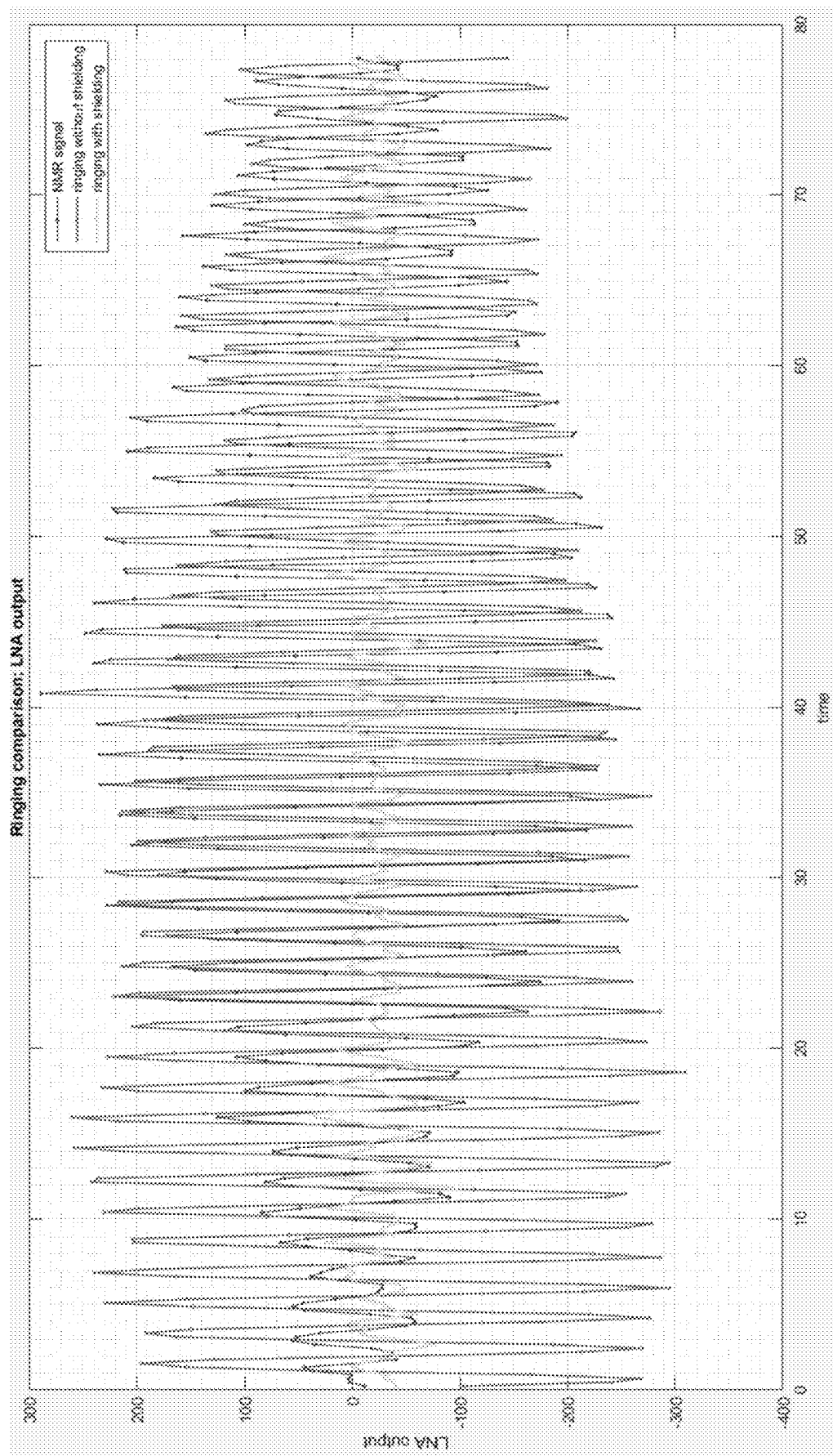
FIG. 5 is a graph in the time domain depicting an NMR signal versus ringing without shielding versus ringing with shielding, according to some embodiments.
Figure 6:
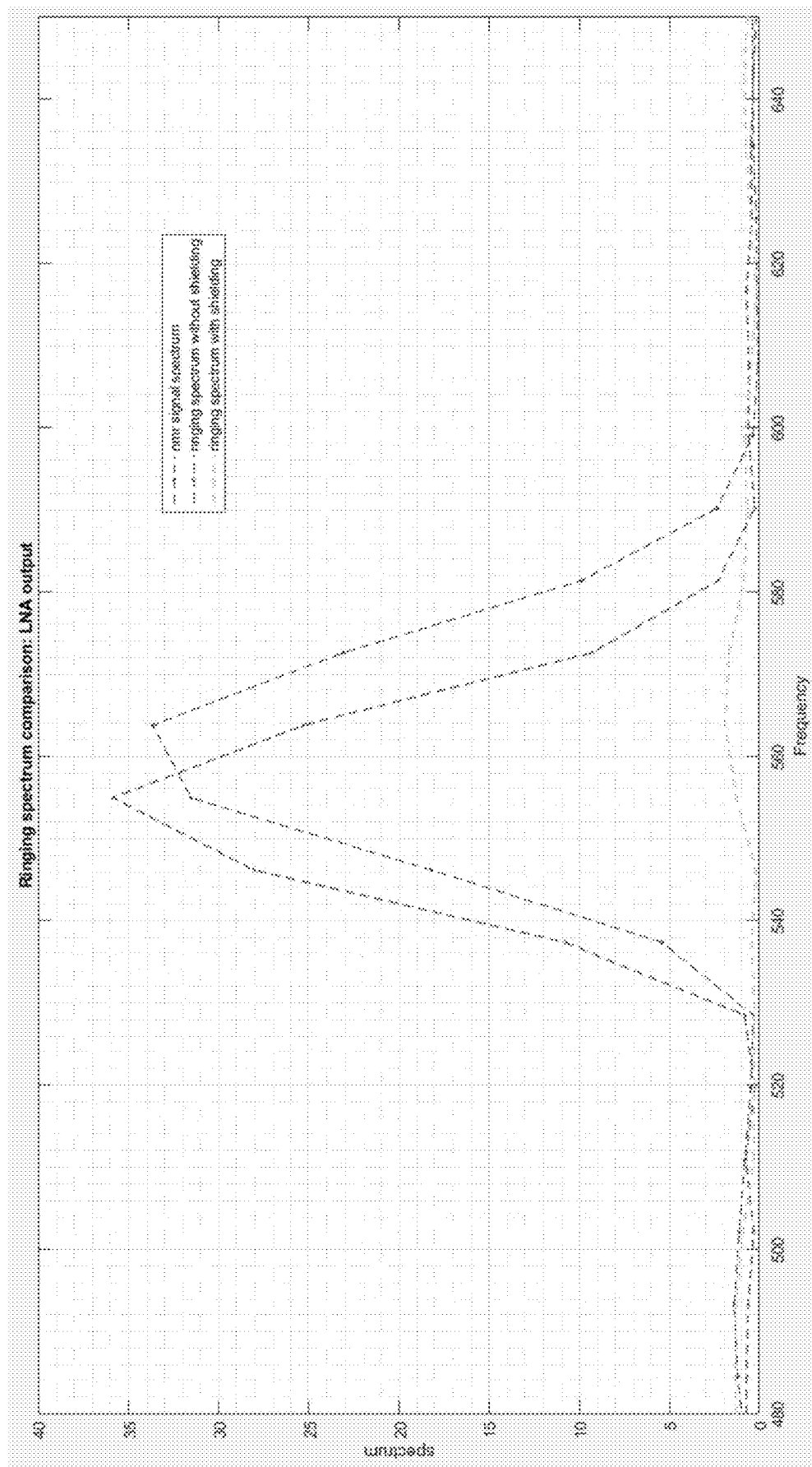
FIG. 6 is a graph in the frequency domain depicting an NMR signal versus ringing without shielding versus ringing with shielding, according to some embodiments.

Because of the shielding provided by the sheets between the transmission lines and the magnets and the sheets between the transmission lines and the outer housing of the NMR logging tool, the ringing is reduced. To illustrate, FIGS. 5-6 show the comparison between shielding and non-shielding configurations. FIG. 5 depicts a graph 500 in the time domain of an NMR signal versus ringing without shielding versus ringing with shielding, according to some embodiments. To further illustrate, FIG. 6 depicts a graph 600 in the frequency domain of an NMR signal versus ringing without shielding versus ringing with shielding, according to some embodiments. Without shielding, the ringing signal is almost as big as the NMR signal, if not bigger, shown in time and frequency domain, which is equivalent to about 100 per unit (p.u.) or more, wherein a unit is equal to a percentage of pore space in a unit of volume of rock. The value of a unit of volume of rock can range from 0 to 100. With shielding, the ringing signal drops by at least of factor of 10, or to about 7 p.u.

Example Operations

Figure 7:
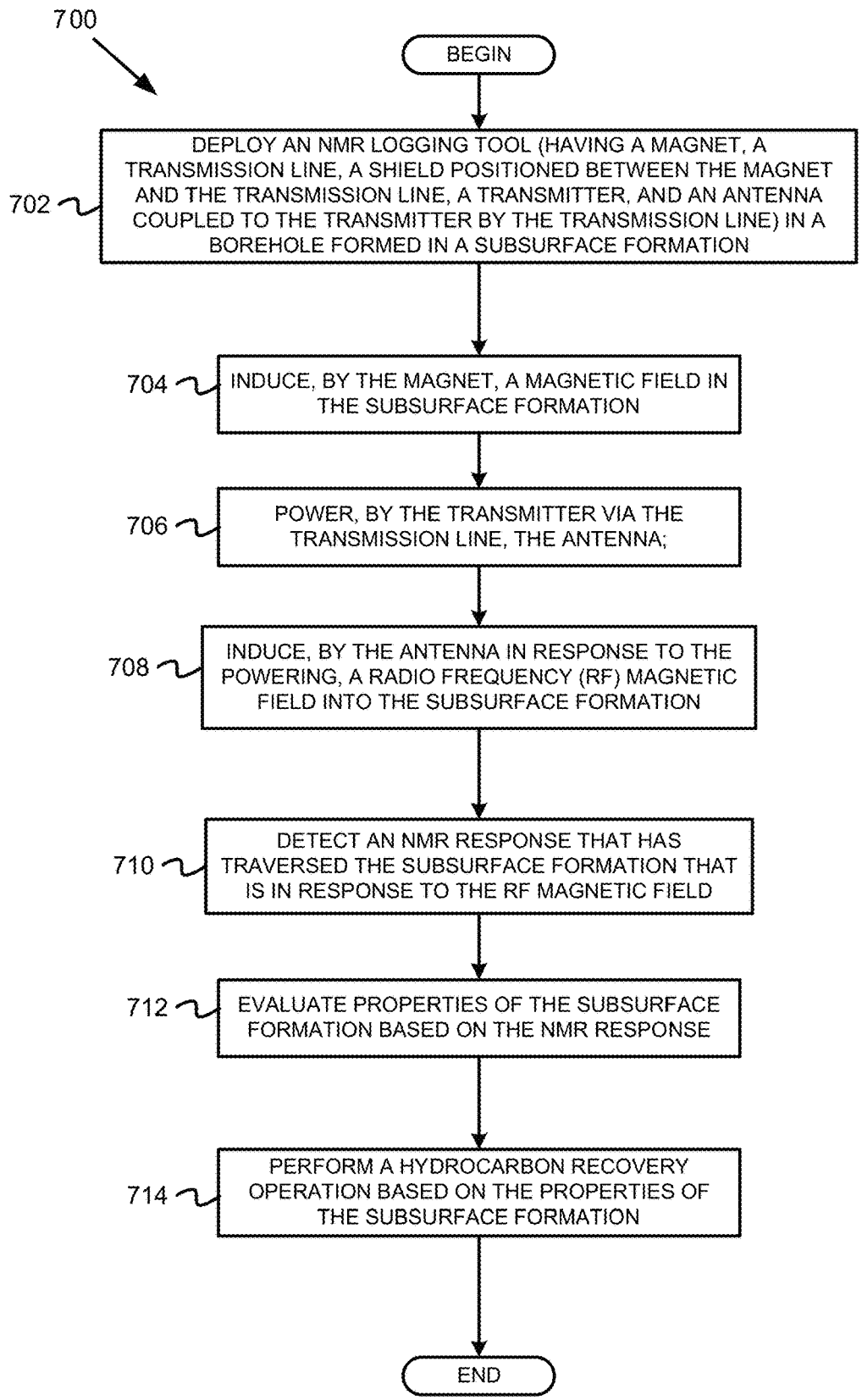
FIG. 7 is a flowchart depicting example operations implemented by an NMR logging tool, according to some embodiments.

Example operations of an NMR logging tool are now described. In particular, FIG. 7 depicts a flowchart of example operations of an NMR logging tool, according to some embodiments. A flowchart 600 is described with reference to the example systems and example NMR logging tool depicted in FIGS. 1-4.

At block 702, an NMR logging tool (that includes a magnet, a transmission line, a first shield positioned between the magnet and the transmission line, a transmitter, and an antenna coupled to the transmitter by the transmission line) is deployed in a borehole created in a subsurface formation. For example, with reference to FIG. 1, the NMR logging tool is deployed in the borehole 112.

At block 704, a magnetic field is induced in the subsurface formation by the magnet. For example, with reference to FIG. 3, the magnets 302 can induce a magnetic field in the subsurface formation.

At block 706, the antenna is powered by the transmitter via the transmission line. For example, with reference to FIG. 3, the antenna 303 is powered by the transmitter 320 via the transmission lines 305.

At block 708, an RF magnetic field is induced into the subsurface formation, by the antenna in response to the powering by the transmitter. For example, with reference to FIG. 3, the antenna 303 induces an RF magnetic field into the subsurface formation surrounding the borehole.

At block 710, an NMR response that has traversed the subsurface formation and that is in response to the RF magnetic field is detected. For example, with reference to FIG. 3, the antenna 303 detects an NMR response that has traversed the subsurface formation and that is in response to the RF magnetic field.

At block 712, properties of the subsurface formation are evaluated based on the NMR response. For example, with reference to FIG. 4, the processor 410 can perform this operation.

At block 714, a hydrocarbon recovery operation based on evaluation of the subsurface formation can be performed. Examples of a hydrocarbon recovery operation can include hydraulic fracturing, perforation operations, well flooding and/or additional drilling on the current borehole, drilling a new borehole, etc.

Example Computer

Figure 8:
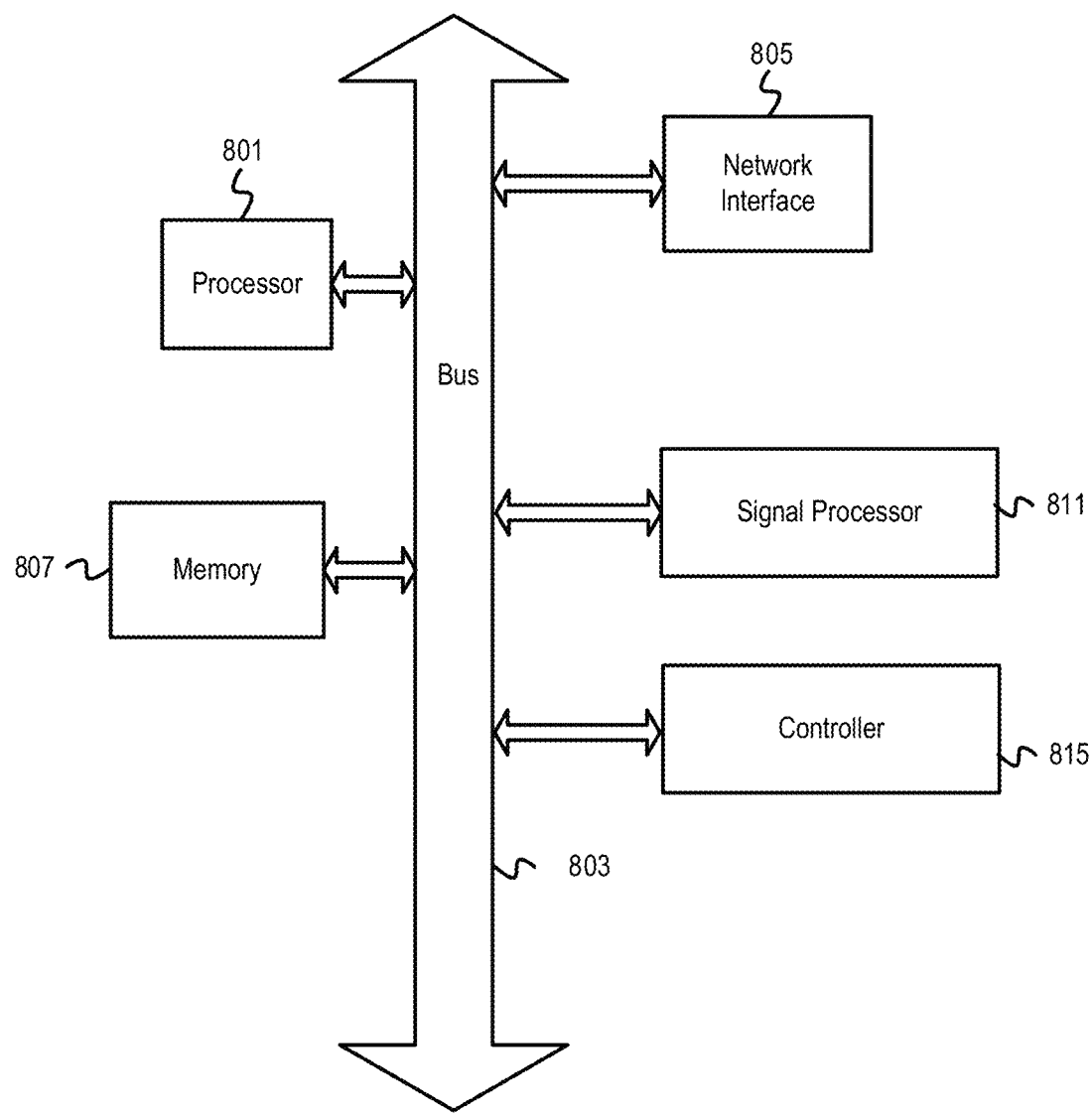
FIG. 8 is a block diagram depicting an example computer, according to some embodiments.

FIG. 8 depicts an example computer, according to some embodiments. The computer includes a processor 801 (possibly including multiple processors, multiple cores, multiple nodes, and/or implementing multi-threading, etc.). The computer includes memory 807. The memory 807 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system also includes a bus 803 (e.g., PCI, ISA, PCI-Express, HyperTransport® bus, InfiniBand® bus, NuBus, etc.) and a network interface 805 (e.g., a Fiber Channel interface, an Ethernet interface, an interne small computer system interface, SONET interface, wireless interface, etc.).

The computer also includes a signal processor 811 and a controller 815. The signal processor 811 can process the NMR response (as described above). For example, the signal processor 811 can perform de-coupling, low noise amplifying, filtering, A/D conversion, etc. The controller 815 can perform various hydrocarbon recovery operations based on the formation evaluation derived from the NMR response (as described above). Any one of the previously described functionalities may be partially (or entirely) implemented in hardware and/or on the processor 801. For example, the functionality may be implemented with an application specific integrated circuit, in logic implemented in the processor 801, in a co-processor on a peripheral device or card, etc. Further, realizations may include fewer or additional components not illustrated in FIG. 8 (e.g., video cards, audio cards, additional network interfaces, peripheral devices, etc.). The processor 801 and the network interface 805 are coupled to the bus 803. Although illustrated as being coupled to the bus 803, the memory 807 may be coupled to the processor 801.

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus.

It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine-readable medium may be a machine-readable signal medium or a machine-readable storage medium. A machine-readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine-readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine-readable storage medium may be any tangible medium that can contain, or store a program for use by or in connection with an instruction execution system, apparatus, or device. A machine-readable storage medium is not a machine-readable signal medium.

A machine-readable signal medium may include a propagated data signal with machine readable program code embodied therein, for example, in baseband or as part of a carrier wave. Such a propagated signal may take any of a variety of forms, including, but not limited to, electromagnetic, optical, or any suitable combination thereof. A machine-readable signal medium may be any machine-readable medium that is not a machine-readable storage medium and that can communicate, propagate, or transport a program for use by or in connection with an instruction execution system, apparatus, or device.

Computer program code for carrying out operations for aspects of the disclosure may be written in any combination of one or more programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code may execute entirely on a stand-alone machine, may execute in a distributed manner across multiple machines, and may execute on one machine while providing results and or accepting input on another machine.

The program code/instructions may also be stored in a machine-readable medium that can direct a machine to function in a particular manner, such that the instructions stored in the machine-readable medium produce an article of manufacture including instructions which implement the function/act specified in the flowchart and/or block diagram block or blocks.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

As used herein, the term "or" is inclusive unless otherwise explicitly noted. Thus, the phrase "at least one of A, B, or C" is satisfied by any element from the set {A, B, C} or any combination thereof, including multiples of any element.

Example Embodiments

Embodiment 1: A nuclear magnetic resonance (NMR) logging tool comprising: a magnet to induce a magnetic field in a subsurface formation; a transmission line; a first shield positioned between the magnet and the transmission line; a transmitter; and an antenna coupled to the transmitter by the transmission line, the antenna to transmit a radio frequency (RF) magnetic field into the subsurface formation in response to the transmitter supplying power by the transmission line. For Embodiment 1, the first shield may comprise a first metallic sheet having a thickness of at least $n\delta$, wherein $\delta$ is a skin depth of the first metallic sheet and n is an integer greater than or equal to 2 and the first metallic sheet may be composed of at least one of copper and aluminum. For Embodiment 1, the NMR logging tool may further comprise a housing that encases the magnet, the transmission line, the first shield, the transmitter, and the antenna; and a second shield positioned between the housing and the transmission line. For Embodiment 1, the housing may comprise a metallic section positioned over the transmission line and the magnet; and a non-metallic section positioned over the antenna. For Embodiment 1, the second shield may comprise one or more second metallic sheets, and the one or more second metallic sheets may be composed of at least one of copper and aluminum. For Embodiment 1, the antenna may be configured to detect an NMR response that has traversed the subsurface formation in response to the RF magnetic field.

Embodiment 2: A method comprising: deploying a nuclear magnetic resonance (NMR) logging tool in a borehole created in a subsurface formation, the NMR logging tool comprising a magnet, a transmission line, a first shield positioned between the magnet and the transmission line, a transmitter, and an antenna coupled to the transmitter by the transmission line; inducing, by the magnet, a magnetic field in the subsurface formation; powering, by the transmitter via the transmission line, the antenna; inducing, by the antenna in response to the powering, a radio frequency (RF) magnetic field into the subsurface formation; and detecting an NMR response that has traversed the subsurface formation that is in response to the RF magnetic field. For Embodiment 2, the method may further comprise determining properties of the subsurface formation based on the NMR response. For Embodiment 2, the method may further comprise performing a hydrocarbon recovery operation based on the properties of the subsurface formation. For Embodiment 2, the first shield may comprise a first metallic sheet. For Embodiment 2, the first shield may comprise a first metallic sheet having a thickness of at least $n\delta$, wherein $\delta$ is a skin depth of the first metallic sheet and n is an integer greater than or equal to 2. For Embodiment 2, the NMR logging tool may comprise a housing that encases the magnet, the transmission line, the first shield, the transmitter, and the antenna and wherein the NMR logging tool comprises a second shield positioned between the housing and the transmission line. For Embodiment 2, the housing may comprise a metallic section positioned over the transmission line and the magnet; and a non-metallic section positioned over the antenna. For Embodiment 2, the second shield may comprise one or more second metallic sheets.

Embodiment 3: A system comprising: a downhole logging tool configured to be disposed within a wellbore; and nuclear magnetic resonance (NMR) logging tool disposed within said logging tool, said NMR logging tool comprising a magnet to induce a magnetic field in a subsurface formation; a transmission line; a first shield positioned between the magnet and the transmission line; a transmitter; and an antenna coupled to the transmitter by the transmission line, the antenna to transmit a radio frequency (RF) magnetic field into the subsurface formation in response to the transmitter supplying power by the transmission line. For Embodiment 3, the first shield may comprise a first metallic sheet having a thickness of at least $n\delta$, wherein $\delta$ is a skin depth of the first metallic sheet and n is an integer greater than or equal to 2. For Embodiment 3, the system may further comprise a housing that encases the magnet, the transmission line, the first shield, the transmitter, and the antenna; and a second shield positioned between the housing and the transmission line. For Embodiment 3, the housing may further comprise a metallic section positioned over the transmission line and the magnet; and a non-metallic section positioned over the antenna.

What is claimed is:

1. A nuclear magnetic resonance (NMR) logging tool comprising:
    a magnet to induce a magnetic field in a subsurface formation;
    a transmission line;
    a first shield positioned between the magnet and the transmission line, wherein the first shield comprises a first metallic sheet having a thickness of at least $n\delta$, wherein $\delta$ is a skin depth of the first metallic sheet and n is an integer greater than or equal to 1;
    a transmitter; and
    an antenna coupled to the transmitter by the transmission line, the antenna to transmit a radio frequency (RF) magnetic field into the subsurface formation in response to the transmitter supplying power by the transmission line.

2. The NMR logging tool of claim 1, wherein n is an integer greater than or equal to 2.

3. The NMR logging tool of claim 1, wherein the first metallic sheet is composed of at least one of copper and aluminum.

4. The NMR logging tool of claim 1, further comprising
    a housing that encases the magnet, the transmission line, the first shield, the transmitter, and the antenna; and
    a second shield positioned between the housing and the transmission line.

5. The NMR logging tool of claim 4, wherein the housing comprises:
    a metallic section positioned over the transmission line and the magnet; and
    a non-metallic section positioned over the antenna.

6. The NMR logging tool of claim 4, wherein the second shield comprises one or more second metallic sheets.

7. The NMR logging tool of claim 6, wherein the one or more second metallic sheets are composed of at least one of copper and aluminum.

8. The NMR logging tool of claim 1, wherein the antenna is configured to detect an NMR response that has traversed the subsurface formation in response to the RF magnetic field.

9. A method comprising:
    deploying a nuclear magnetic resonance (NMR) logging tool in a borehole created in a subsurface formation, the NMR logging tool comprising a magnet, a transmission line, a first shield positioned between the magnet and the transmission line and comprising a first metallic sheet having a thickness of at least $n\delta$, wherein $\delta$ is a skin depth of the first metallic sheet and n is an integer greater than or equal to 1, a transmitter, and an antenna coupled to the transmitter by the transmission line;
    inducing, by the magnet, a magnetic field in the subsurface formation;
    powering, by the transmitter via the transmission line, the antenna;
    inducing, by the antenna in response to the powering, a radio frequency (RF) magnetic field into the subsurface formation; and
    detecting an NMR response that has traversed the subsurface formation that is in response to the RF magnetic field.

10. The method of claim 9, further comprising determining properties of the subsurface formation based on the NMR response.

11. The method of claim 10, further comprising performing a hydrocarbon recovery operation based on the properties of the subsurface formation.

12. The method of claim 9, wherein n is an integer greater than or equal to 2.

13. The method of claim 9, wherein the NMR logging tool comprises a housing that encases the magnet, the transmission line, the first shield, the transmitter, and the antenna and wherein the NMR logging tool comprises a second shield positioned between the housing and the transmission line.

14. The method of claim 13, wherein the housing comprises:

a metallic section positioned over the transmission line and the magnet; and a non-metallic section positioned over the antenna.

15. The method of claim 13, wherein the second shield comprises one or more second metallic sheets.

16. A system comprising:

a downhole logging tool configured to be disposed within a wellbore; and nuclear magnetic resonance (NMR) logging tool disposed within said downhole logging tool, said NMR logging tool comprising, a magnet to induce a magnetic field in a subsurface formation;

a transmission line;

a first shield positioned between the magnet and the transmission line, wherein the first shield comprises a first metallic sheet having a thickness of at least $n\delta$, wherein $\delta$ is a skin depth of the first metallic sheet and n is an integer greater than or equal to 1;

a transmitter; and an antenna coupled to the transmitter by the transmission line, the antenna to transmit a radio frequency (RF) magnetic field into the subsurface formation in response to the transmitter supplying power by the transmission line.

17. The system of claim 16, wherein n is an integer greater than or equal to 2.

18. The system of claim 16, further comprising:

a housing that encases the magnet, the transmission line, the first shield, the transmitter, and the antenna; and a second shield positioned between the housing and the transmission line.

19. The system of claim 18, wherein the housing comprises:

a metallic section positioned over the transmission line and the magnet; and a non-metallic section positioned over the antenna.

* * * * *